United States Patent [19]

Berté et al.

[11] Patent Number: 4,656,707
[45] Date of Patent: Apr. 14, 1987

[54] METHOD OF FABRICATING A HIGH-FREQUENCY PIEZOELECTRIC RESONATOR

[75] Inventors: Marc Berté ; Louis Bidard; Serge Lechopier, all of Sartrouville, France

[73] Assignee: Compagnie d'Electronique et de Piezo-Electricite, Sartrouville, France

[21] Appl. No.: 705,025

[22] Filed: Feb. 25, 1985

Related U.S. Application Data

[62] Division of Ser. No. 498,513, May 26, 1983, Pat. No. 4,517,485.

[30] Foreign Application Priority Data

Jun. 1, 1982 [FR] France ................ 82 09511

[51] Int. Cl.$^4$ .................................. H01L 41/22
[52] U.S. Cl. ..................... 29/25.35; 310/320; 310/364; 310/369
[58] Field of Search ............ 29/25.35; 310/320, 364, 310/367, 369, 312

[56] References Cited

U.S. PATENT DOCUMENTS

| | | |
|---|---|---|
| 2,095,376 | 10/1937 | Bechmann . |
| 2,510,811 | 6/1950 | Gale . |
| 3,222,622 | 12/1965 | Curran et al. . |
| 3,396,287 | 8/1968 | Horton . |
| 3,694,677 | 9/1972 | Guttwein et al. . |
| 3,721,841 | 3/1973 | Wilson . |
| 3,940,638 | 2/1976 | Teryama . |
| 4,339,683 | 7/1982 | Scott et al. . |
| 4,517,485 | 5/1985 | Berte et al. . |

FOREIGN PATENT DOCUMENTS

2484734 12/1981 France .

OTHER PUBLICATIONS

L'Onde Electrique, vol. 59, No. 11, Nov. 1979; Paris (FR); M. Berie et al.: Resonateurs piezoelectriques a ondes de volume fonctionnant a des frequences fondamentales.
Resonaterus piezoelectriques a ondes de volume fonctionnant superierues a 100 MHZ.

*Primary Examiner*—Carl E. Hall
*Attorney, Agent, or Firm*—Cushman, Darby & Cushman

[57] ABSTRACT

A method of fabricating a high-frequency piezoelectric resonator includes the steps of (a) forming a region of reduced thickness in a central portion of a quartz disk, a step zone being formed at the transition between the thinned region and the non-thinned region; (b) depositing a conductive tongue on the step so as to extend over a portion of the non-thinned region and over a portion of the thinned region; (c) mounting two lead attachments on the disk; and (d) depositing first and second electrodes on the disc, each electrode coupled to a respective one of the lead attachments, a portion of the first electrode being deposited on the conductive tongue.

11 Claims, 7 Drawing Figures

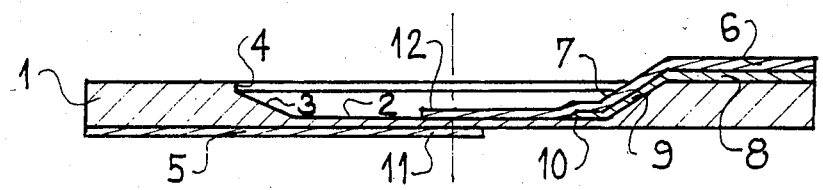
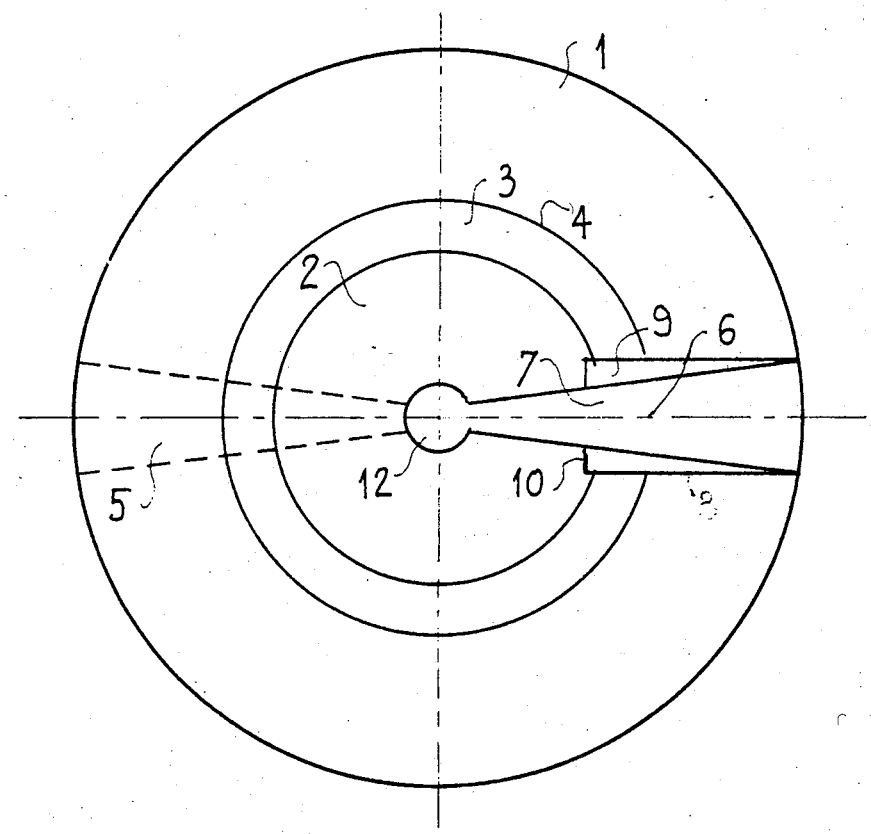

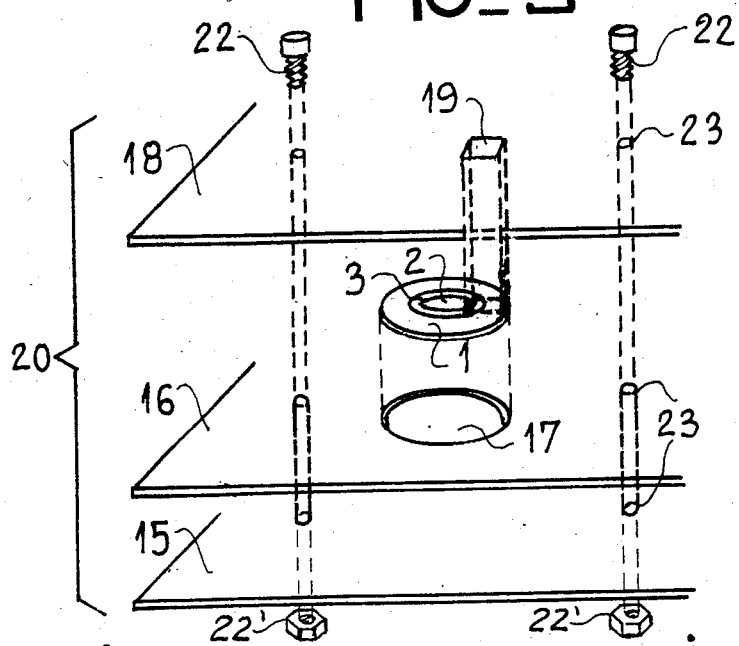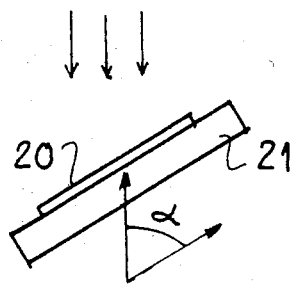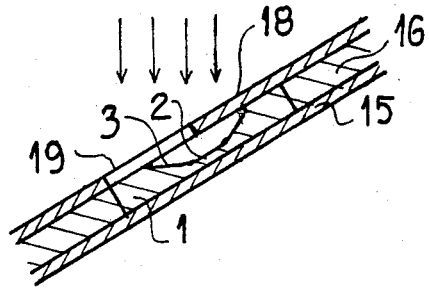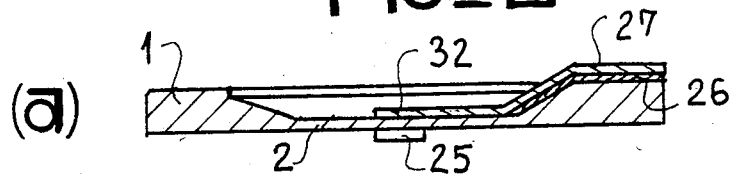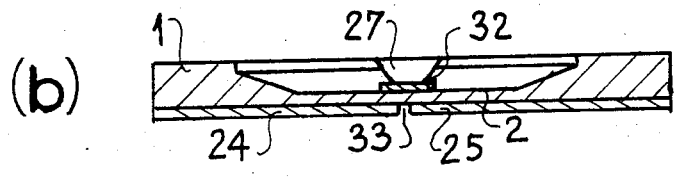

METHOD OF FABRICATING A HIGH-FREQUENCY PIEZOELECTRIC RESONATOR

This is a division of application Ser. No. 498,513 filed May 26, 1983, now U.S. Pat. No. 4,517,485.

BACKGROUND OF THE INVENTION

This invention relates to a method of fabricating a high-frequency piezoelectric resonator and in particular a filter.

U.S. Pat. No. 3,694,677 discloses a piezoelectric resonator in which a quartz disk is provided with a thinned central region forming a diaphragm, said thinned region being joined to the non-thinned region by a zone which forms a step. An electrode extends from the exterior of the disk across the stepped region to the center of the thinned region. There is placed on the other face of the disk another electrode which also extends from the periphery of the disk to the center of the thinned region. Said other face can be flat or else it can also have a stepped zone which must pass over the electrode.

It is found in practice that the fabrication of electrodes by sputtering or evaporation of a metal film-layer does not prove satisfactory. The fabrication of these electrodes must in fact meet a number of essential requirements. In the first place, the electrodes must have an electrical resistance which is as low as possible and must also be capable of withstanding the vibrations to which the crystal is subjected. In the second place, the electrodes must not have an excessive mass in order to avoid any risk of producing considerable changes in the frequency of the crystal.

In practice, the electrodes employed are of silver or preferably of aluminum since this is a relatively light-weight material having good electrical conductivity. The thickness of the electrodes is of on the order of approximately 1000 Angströms, thus making it possible to obtain a resonator having a high Q factor or loaded quality factor.

If the electrodes are fabricated in accordance with the method taught by U.S. Pat. No. 3,694,677, it is found that they have a brittle point at the level of the step. This means that, after a certain period of use and sometimes even immediately after the aging treatment usually performed in order to stabilize the resonator, this latter becomes unserviceable as a result of interruption of electrical continuity.

The production of a reliable piezoelectric resonator therefore makes it necessary to modify the fabrication of the electrodes in order to ensure satisfactory service life of said electrodes.

Furthermore, the present Applicant has found that any accumulation of material at the level of the stepped zone induces stresses in the thinned region of the crystal. These stresses impair the thermal drift of the crystal.

SUMMARY OF THE INVENTION

Accordingly, it is an object of the present invention to provide a high-frequency resonator having electrodes which are reliable over a long period of time without thereby affecting the properties of the resonator.

The invention also relates to a high-frequency piezoelectric resonator of the type comprising a plate or disk of quartz (or like piezoelectric material) in which a non-thinned region surrounds a thinned region forming a diaphragm. The thinned region is joined to the non-thinned region by means of at least one zone forming a step and provision is made for at least one electrode which extends across the step from the non-thinned region to the thinned region. The resonator is distinguished by the fact that said electrode is associated with a conductive tongue formed by a metallic film-layer deposited in the stepped zone.

Said metallic film-layer is preferably deposited by sputtering or vacuum evaporation.

The conductive tongue aforesaid can be placed beneath the electrode and can be of gold.

The tongue can have a mean thickness of on the order of 1000 Angströms.

One electrode can be of silver.

One electrode can have a thickness within the range of 500 to 1000 Angströms.

The conductive tongue can be of greater width than the associated electrode.

Said conductive tongue can extend from the non-thinned region to that portion of the thinned region which is adjacent to the stepped zone.

The invention further relates to a resonator made up of two elementary resonators coupled together in such a manner as to form a filter.

Finally, the invention is concerned with a method of fabrication of a resonator of the aforementioned type comprising a preliminary step of formation by ion machining of a region of reduced thickness in the central portion of a quartz plate or quartz disk, the thinned region being separated from the non-thinned region by a zone which forms a step. The invention essentially comprises the following process steps:

(a) a step involving deposition of a conductive tongue which extends across the stepped zone;
(b) a step which involves mounting of the plate or disk on at least two conductive masts (lead attachments) by means of a conductive cement;
(c) a step involving deposition of the electrodes, one electrode being so arranged as to cover the conductive tongue at least to a partial extent, deposition by the sputtering technique being performed in such a manner as to ensure that each conductive mast aforesaid is in contact with one electrode.

In a preferred embodiment, the method comprises an operation involving measurement of the resonator frequency during deposition of the electrodes in such a manner as to stop the deposition process as soon as the desired value of frequency has been attained.

BRIEF DESCRIPTION OF THE DRAWINGS

Other features of the invention will be more apparent upon consideration of the following description and accompanying drawings, wherein:

FIGS. 1 and 2 are respectively a vertical sectional view and a top view illustrating a resonator in accordance with the invention;

FIG. 3 illustrates a masking device for the formation of the conductive tongues in accordance with the invention;

FIGS. 4 and 5 illustrate the deposition operations involved in the formation of the conductive tongues in accordance with the invention;

FIGS. 6a and 6b are two vertical sectional views at right angles to each other and showing a resonator in accordance with the invention and in which the electrodes are so arranged as to form a filter.

DETAILED DESCRIPTION OF THE PRESENTLY PREFERRED EXEMPLARY EMBODIMENT

In FIGS. 1 and 2, a piezoelectric disk comprises a non-thinned peripheral region 1 surrounding a thinned region 2, the junction between these two regions being constituted by a zone forming a step as a result of a ion machining process. Starting from the surface, the step is constituted by a cylindrical region 4 followed by a conical region 3. For example in the case of a disk having a thickness of 50 microns and a thickness of the diaphragm 2 on the order of 5 to 10 microns, the cylindrical region 4 has a depth of approximately 10 microns. One of the electrodes 5 is placed on the flat underface of the disk and extends from the periphery of this latter to the center of the diaphragm 2 and terminates in a circular central region 11. The electrode 5 has the general shape of a triangle, the base of which is located at the periphery of the disk and the vertex of which is located at the center of the diaphragm 2. This shape facilitates the electrical connection of the electrodes at their periphery while adding the smallest possible quantity of material at the level of the diaphragm 2.

The other electrode 6 also extends from the periphery of the disk to the center of the diaphragm 2 and terminates in a circular central region 12 located opposite to the circular region 11. Likewise said electrode has the general shape of a triangle, the base of which is located at the periphery of the disk. A conductive tongue 8 is preferably placed beneath the electrode 6 and extends from the periphery of the disk to the external portion of the diaphragm 2 which is adjacent to the stepped zone 3. Said conductive tongue 8 is a metallic layer which is deposited on the disk and has a rectangular shape when looked at from above. In this embodiment, the tongue 8 is therefore of greater width than the electrode, thus increasing the area on which an electrical contact is established at the level of the stepped zone. Furthermore, the conductive tongue 8 extends at the level of the diaphragm over a distance which is just sufficient to facilitate electrical connection at the level of the step. It will be noted that the active zone of the conductive tongue is constituted by the portion located at the level of the step or in other words the zone shown at 9, by the portion 10 which extends over a minimum distance on the diaphragm 2, and by the portion which is joined to the flat portion of the electrode 6.

In FIG. 3, a masking device 20 for the formation of the conductive tongues comprises a base plate 15, an intermediate plate 16 provided with a plurality of holes 17 (only one of which is illustrated), and a top plate 18 provided with openings 19 (only one of which is illustrated) corresponding to the shape of the conductive tongues to be formed on a piezoelectric disk provided with a diaphragm 2. The holes 17 have an external diameter corresponding to the diameter of the piezoelectric disks. The thickness of the intermediate plate 16 is substantially greater than that of the piezoelectric disks, with the result that the disks are maintained in position by clamping between the plates 15 and 18. The plates 15, 16 and 18 are held together by means of clamping screws 22 which are engaged within holes 23 and cooperate with nuts 22'.

As shown in FIG. 4, the support 20 fitted with the piezoelectric disks is mounted on a plate 21 which is inclined at an angle α with respect to the direction of sputtering or evaporation.

As shown in detail in FIG. 5, the portion of region 3 on which the conductive tongue is formed can be placed substantially at right angles to the direction of sputtering as a result of the angle of inclination aforesaid. Maximum thickness in the active zone of the conductive tongue can thus be obtained by evaporation. The conductive tongue 8 can be of any metal which permits deposition either by sputtering or evaporation, gold being particularly suitable for this purpose. Its thickness (for example of the order of 1000 Angströms) is such as to permit reinforcement of the electrode 6 without adding an excessive quantity of material at the level of the stepped portion.

Each piezoelectric disk fitted with its conductive tongue is bonded to two conductive masts by means of a conductive cement. The electrodes 5, 6 are then deposited, each of the electrodes being in contact with one of the masts. The electrode which extends across the stepped portion covers the conductive tongue at least partially.

During deposition of the electrodes, the frequency of the resonator is measured as soon as this is permitted by the thickness of the electrodes. The addition of material at the level of the diaphragm as a result of deposition of the electrodes has the effect of reducing the frequency of the quartz. The deposition operation is interrupted when the desired frequency of the quartz is precisely attained.

In a subsequent process step, the quartz is placed within a vacuum-tight enclosure and subjected to an aging treatment (residence time of a few hours at a temperature of the order of 95°C.).

As shown in FIGS. 6a and 6b, a piezoelectric filter is obtained at the level of a diaphragm 2 as a result of coupling between two individual resonators. To this end, two electrodes are placed close together on one of the faces of the diaphragm, and a grounded electrode is disposed on the opposite face, thereby ensuring that its extremity is located opposite to the gap between the two electrodes of the other face. Thus one electrode 27 is disposed on the top face of a quartz disk, extends from the periphery of said disk to the center of the diaphragm 2, and has a circular termination 32 at the center. Two electrodes 24 and 25 disposed in a general direction at right angles to the electrode 27 extend from the periphery of the underface of the piezoelectric disk to the center of the diaphragm 2. At the center, a gap 33 is left between said electrodes 24 and 25 and the width of said gap determines the coupling between the two resonators.

What is claimed is:
1. A method fabricating a resonator comprising the steps of:
   forming a thinned region of reduced thickness in a central region of one face of a quartz plate, a step zone forming the transition between the thinned region and a non-thinned region of said one face;
   depositing a conductive tongue of a first shape on said one face extending over said step zone, a portion of said non-thinned region and a portion of said thinned region, said conductive tongue reinforcing said step zone;
   mounting two conductive masts on said plate; and
   depositing first and second electrodes on said plate, each electrode coupled to a respective one of said masts, a portion of said first electrode being deposited on said conductive tongue, said first electrode having a second shape different from said first shape, said first electrode having a width narrower than a width of said conductive tongue at said step zone.

2. A method according to claim 1 wherein the electrode depositing step includes the steps of:
   detecting the resonator frequency during deposition of said first and second electrodes; and
   stopping the electrode deposition when a predetermined resonator frequency is detected.

3. A method according to claim 1 wherein said forming step includes the step of ion machining said thinned region.

4. A method according to claim 1 wherein said quartz plate is a quartz disk.

5. A method according to claim 1 wherein the electrode depositing step includes the step of depositing said first and second electrodes on opposite faces of said quartz plate.

6. A method according to claim 1 wherein the conductive tongue is deposited by a sputtering technique.

7. A method according to claim 1 wherein the first and second electrodes are deposited by a sputtering technique.

8. A method for forming electrodes on a quartz, plate resonator having a thinned-down region of reduced thickness in a central portion of one face of said plate, comprising the steps of:
   depositing a conductive tongue of a first shape on said one face of said plate, said tongue being deposited on a portion of said thinned-down region and extending over a portion of a non-thinned region of the plate, said conductive tongue reinforcing a transition zone between said thinned-down and non-thinned region; and
   depositing first and second electrodes on said plate, a portion of said first electrode being deposited on said conductive tongue, said first electrode having a second shape different from said first shape, said first electrode having a width narrower than a width of said conductive tongue at said transition zone.

9. A method according to claim 8 wherein the electrode depositing step includes the steps of:
   detecting the resonator frequency during deposition of said first and second electrodes; and
   stopping the electrode deposition when a predetermined resonator frequency is detected.

10. A method according to claim 8 further including the step of mounting two conductive masks to said plate, and wherein the electrode depositing step includes the step of depositing said electrodes to cause each mast to be coupled to a respective one of said electrodes.

11. A method according to claim 8 wherein the electrode depositing step includes the step of depositing said first and second electrodes on opposite sides of said plate.

* * * * *